(12) United States Patent  
Ametani

(10) Patent No.: US 7,563,643 B2  
(45) Date of Patent: Jul. 21, 2009

(54) WAFER PROCESSING APPARATUS

(75) Inventor: Minoru Ametani, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 11/704,454

(22) Filed: Feb. 8, 2007

(65) Prior Publication Data

US 2007/0187036 A1 Aug. 16, 2007

(30) Foreign Application Priority Data

Feb. 13, 2006 (JP) .............................. 2006-035159

(51) Int. Cl.
  *H01L 21/00* (2006.01)
  *B29C 63/00* (2006.01)
(52) U.S. Cl. ........................ 438/114; 156/344
(58) Field of Classification Search ................ 156/521, 156/344, 584; 438/114
  See application file for complete search history.

(56) References Cited

U.S. PATENT DOCUMENTS

| | | | |
|---|---|---|---|
| 4,696,712 | A | 9/1987 | Nonaka |
| 5,118,369 | A | 6/1992 | Shamir |
| 6,249,943 | B1 | 6/2001 | Matsushita et al. |
| 6,946,311 | B2 | 9/2005 | Kawashima |
| 2001/0010972 | A1 | 8/2001 | Robinson et al. |
| 2004/0074607 | A1 | 4/2004 | Hayasaka et al. |
| 2006/0068524 | A1* | 3/2006 | Yamamoto .................. 438/118 |
| 2006/0219359 | A1 | 10/2006 | Miyamoto et al. |
| 2007/0162175 | A1 | 7/2007 | Segawa et al. |
| 2007/0277934 | A1* | 12/2007 | Kawashima et al. ........ 156/584 |

FOREIGN PATENT DOCUMENTS

| | | |
|---|---|---|
| EP | 1 310 432 B1 | 2/2006 |
| JP | 62-8966 | 1/1987 |
| JP | 11-074231 | 3/1999 |
| JP | 2000-68293 | 3/2000 |

(Continued)

OTHER PUBLICATIONS

Patent Abstracts of Japan, Publication No. 2000068293 A, Published on Mar. 3, 2000, in the name of Tsujimoto et al.

(Continued)

*Primary Examiner*—W. David Coleman
(74) *Attorney, Agent, or Firm*—Christie, Parker & Hale, LLP.

(57) ABSTRACT

A wafer processing apparatus (10), for processing a wafer (20) with a surface protective film (110) attached on the front surface (21) on which at least one circuit pattern is formed, includes a dicing tape application unit (30) for attaching a dicing tape (3) on a frame (36) and the wafer, a surplus dicing tape take-up unit (40) for taking up the surplus part of the dicing tape attached on the frame and the wafer and a surface protective film peeling unit (50) for peeling the surface protective film from the wafer using a peeling tape (4). At least one of the dicing tape application unit, the surplus dicing tape take-up unit and the surface protective film peeling unit is slidably arranged in that order on common rails (91, 92). As a result, tape can be loaded and the maintenance work on each unit can be carried out easily.

7 Claims, 10 Drawing Sheets

FOREIGN PATENT DOCUMENTS

| JP | 2002-0089180 | 11/2002 |
|----|--------------|---------|
| JP | 2002-343756 | 11/2002 |
| JP | 2005-317711 | 11/2005 |
| JP | 2007-214496 | 8/2007 |
| KR | 2002-0026668 | 4/2002 |

OTHER PUBLICATIONS

Patent Abstracts of Japan, Publication No. 62-008966; Date of Publication: Jan. 16, 1987; in the name of Minoru Ametani et al.

Patent Abstracts of Japan, with English translation of specification, Publication No. 2002-343756; Date of Publication: Nov. 29, 2002; in the name of Kazuo Kabayashi.

Office Action, with English Translation, dated Jan. 30, 2008 for corresponding Korean Patent Application No. 10-2007-0013959, indicating the relevance of JP 62-008966 and JP 2002-0089180.

Korean Patent Abstracts, Publication No. 1020020026668 A; Date of Publication: Apr. 12, 2002; in the name of No Sin Park.

Australian Search Report mailed Oct. 8, 2007 corresponding to a related patent application for patent application No. SG 200703938-1; indicating the relevance of US 5,228,369; US 2001/0010972; US 2004/0074607; and EP 1 310 432.

Patent Abstracts of Japan, Publication No. 2005-317711; Date of Publication: Nov. 10, 2005; in the name of Tsujimoto et al.

Australian Patent Office Search Report dated Mar. 21, 2007 for corresponding Singapore Patent Application No. 200700265-2.

English translation of Japan Patent Publication JP 2007-214496 listed above.

English translation of Japan Publication JP 11-074231 listed above.

U.S. Notice of Allowance dated Sep. 12, 2008, for related U.S. Appl. No. 11/752,146, noting listed references in this IDS.

* cited by examiner

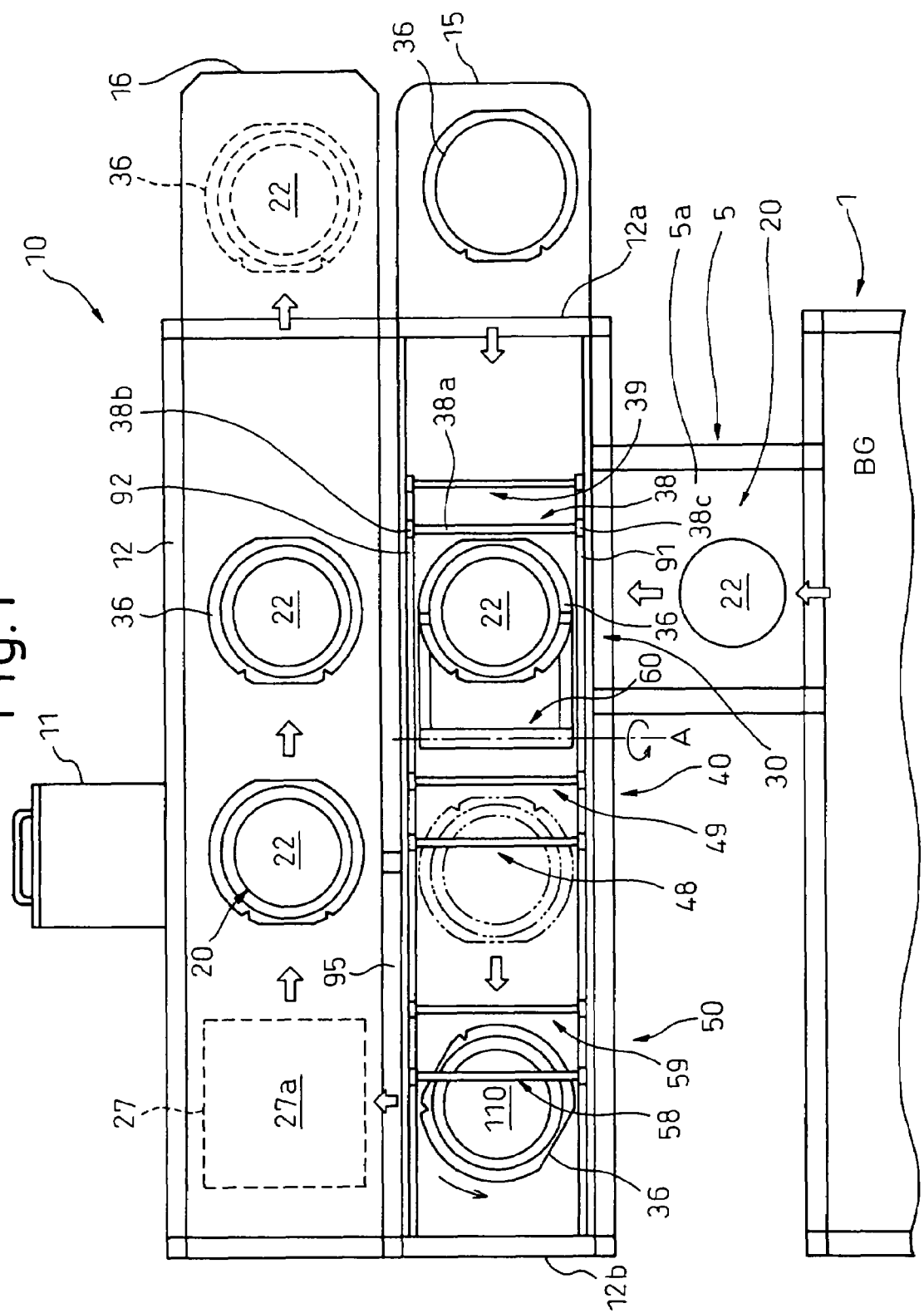

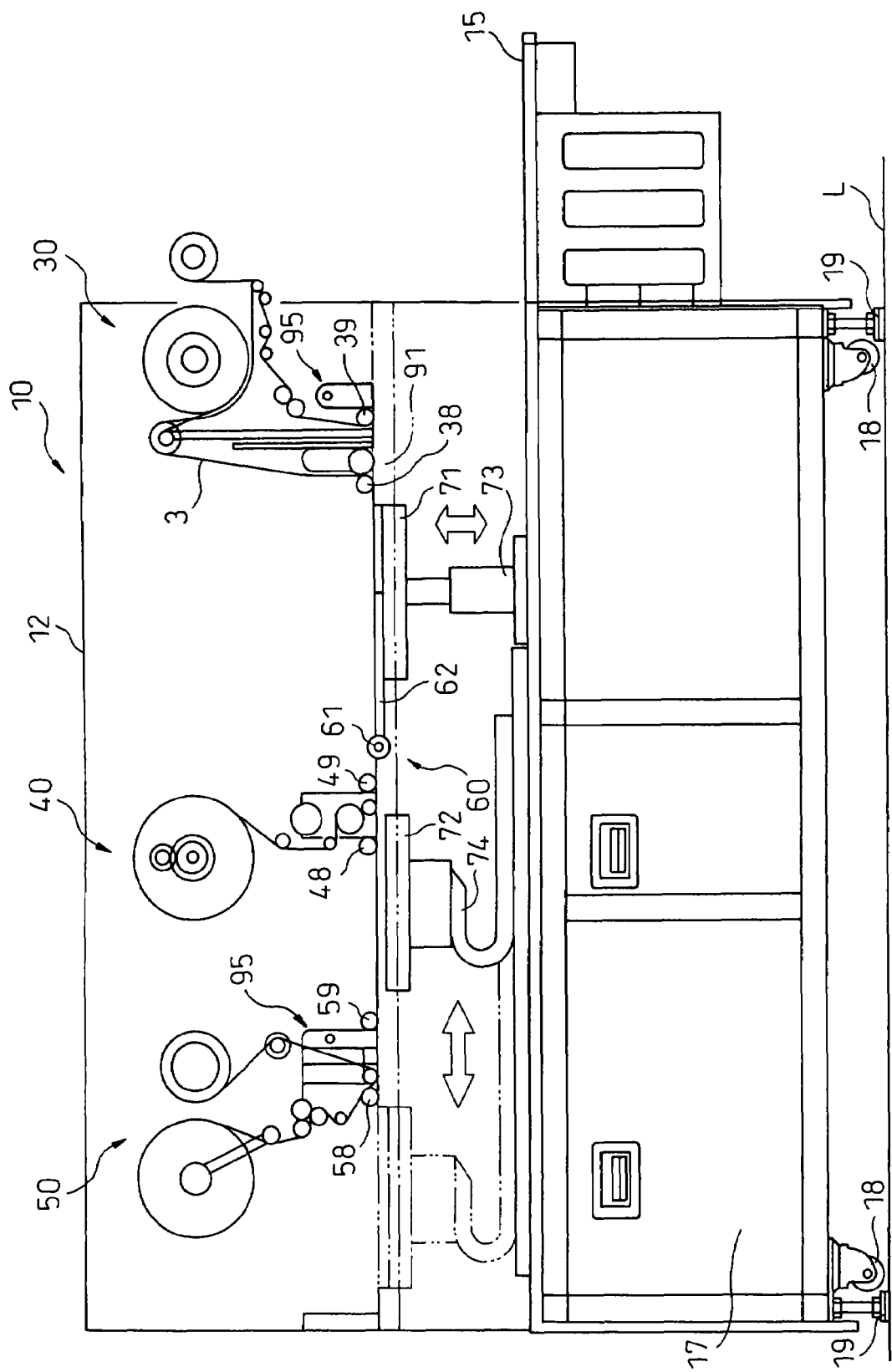

WAFER PROCESSING APPARATUS

CROSS-REFERENCE TO RELATED APPLICATION

This application claims priority of Japanese Patent Application Number 2006-035159, filed on Feb. 13, 2006.

BACKGROUND OF THE INVENTION

1. Field of the Invention

This invention relates to a wafer processing apparatus for processing a wafer having a front surface on which at least a circuit pattern is formed and on which a surface protective film is attached.

2. Description of the Related Art

In the semiconductor manufacturing field, the wafer tends to increase in size year by year. Also, the wafer has become thinner and thinner to improve the mounting density. In order to reduce the thickness of the wafer, back grinding is carried out to grind the back surface of the semiconductor wafer. During back grinding, a surface protective film is attached on the front surface of the wafer to protect the circuit patterns formed on the front surface of the wafer.

The wafer, after being back ground, is transported to a wafer processing apparatus. The wafer processing apparatus disclosed in Japanese Unexamined Patent Publication No. 2000-068293 includes a wafer positioning unit, a mount unit and a surface protective film peeling unit. The wafer is set in reference position by the wafer positioning unit, and integrated with a mount frame in the mount unit by being attached a dicing tape thereon. After that, the surface protective film attached on the front surface of the wafer is peeled off by the surface protective film peeling unit.

According to Japanese Unexamined Patent Publication No. 2000-068293, however, the three units including the wafer positioning unit, the mount unit and the surface protective film peeling unit are built in the wafer processing apparatus, and therefore, the intervals between the units are reduced. In the case where the dicing tape or the peeling tape is loaded (set) on the mount unit or the surface protective film peeling unit, respectively, the other units may constitute an obstacle. It is therefore not easy to load the tape on a predetermined unit. For a similar reason, the cleaning or the maintenance of each unit is a bothersome job.

A comparatively long interval between the units of the wafer processing apparatus would facilitate the loading of the tape and the maintenance work of each unit. However, size and weight of the wafer processing apparatus will be increased as a whole. Therefore, the space and the load capacity corresponding to the resultant bulky wafer processing apparatus is necessary.

This invention has been achieved in view of this situation, and the object thereof is to provide a wafer processing apparatus in which the tape can be loaded and the maintenance of each unit can be carried out easily without increasing the apparatus size.

SUMMARY OF THE INVENTION

In order to achieve the object described above, according to a first aspect of the invention, there is provided a wafer processing apparatus, for processing a wafer having a front surface on which at least a circuit pattern is formed and on which a surface protective film is attached, comprising a dicing tape application unit for attaching a dicing tape on the mount frame and the back surface of the wafer thereby to integrate the mount frame and the wafer with each other and a surplus dicing tape take-up unit for taking up the surplus part of the dicing tape attached on the mount frame and the wafer, wherein at least one of the dicing tape application unit and the surplus dicing tape take-up unit is arranged slidably on at least one rail of the wafer processing apparatus.

According to a second aspect of the invention, there is provided a wafer processing apparatus of the first aspect, further comprising a surface protective film peeling unit for peeling the surface protective film from the front surface of the wafer using a peeling tape, wherein at least one of the dicing tape application unit, the surplus dicing tape take-up unit and the surface protective film peeling unit is slidably arranged on the rail.

Specifically, in the first and second aspects of the invention, each unit can be appropriately slid on the rail and a clearance can be formed between the desired units at the time of loading the dicing tape and/or the peeling tape and the maintenance of each unit. As a result, the tape can be loaded and the maintenance of each unit can be carried out without any other unit constituting an obstacle.

According to a third aspect of the invention, there is provided a wafer processing apparatus of the second aspect, wherein the dicing tape application unit, the surplus dicing tape take-up unit and the surface protective film peeling unit are slidably arranged in that order on a common rail.

Specifically, in the third aspect of the invention, the units are arranged in the order of the processing steps and therefore the distance by which the wafer is transported is minimized.

According to a fourth aspect of the invention, there is provided a wafer processing apparatus of the second or third aspect, wherein at least one of the dicing tape application unit, the surplus dicing tape take-up unit and the surface protective film peeling unit has a cleaning nozzle for supplying a cleaning fluid.

Specifically, in the fourth aspect of the invention, a table for supporting the wafer or the wafer itself can be cleaned without using any specific cleaning unit. Dry air or the like is supplied from a cleaning nozzle so that the foreign matter generated at the time of back grinding is removed from the wafer surface.

According to a fifth aspect of the invention, there is provided a wafer processing apparatus of any of the second to fourth aspects, further comprising a holding means for holding the mount frame of the wafer, wherein after the surplus dicing tape is taken up by the surplus dicing tape take-up unit, the holding means rotates the mount frame, together with the wafer, by 180 degrees around a horizontal rotation axis thereby to transport while inverting the mount frame and the wafer.

Specifically, in the fifth aspect of the invention, the wafer can be transported, simply by rotating it, from the surplus dicing tape take-up unit to the surface protective film peeling unit. In the surface protective film peeling unit, the front surface of the wafer is required to be directed up, and therefore the fifth aspect of the invention in which the wafer is inverted and transported at the same time is especially advantageous. Also, it is desirable to secure the space required for the rotation of the wafer, etc. by sliding the dicing tape application unit and the surplus dicing tape take-up unit away from each other on the rail.

According to a sixth aspect of the invention, there is provided a wafer processing apparatus of any of the first to fifth aspects, wherein a table for supporting the wafer in the surface protective film peeling unit can be rotated around a vertical axis in such a manner that the peeling direction in which the surface protective film is peeled by the surface protective film peeling unit and the bisector of the corners of the circuit patterns of the wafer are substantially parallel to each other.

Specifically, in the sixth aspect of the invention, the adhesive of the surface protective film is uniformly detached from the corners of the circuit patterns along the grooves between the circuit patterns and therefore, the adhesive can be prevented from being left as a residue in the groove between the circuit patterns.

According to a seventh aspect of the invention, there is provided a wafer processing apparatus of any of the first to sixth aspects, wherein the surface protective film has the ultraviolet curing characteristic and is cured by the ultraviolet light radiated thereon, the apparatus further comprising a first ultraviolet light radiation means for radiating the ultraviolet light on the surface protective film before the surface protective film is peeled.

Specifically, in the seventh aspect of the invention, the adherence of the surface protective film is weakened by radiating ultraviolet light, from an ultraviolet light radiation means, onto the surface protective film so that the surface protective film may be easily peeled off from the wafer.

According to an eighth aspect of the invention, there is provided a wafer processing apparatus of any of the first to seventh aspects, wherein the dicing tape has the ultraviolet curing characteristic and is cured by the ultraviolet light radiated thereon, the apparatus further comprising a second ultraviolet light radiation means for radiating ultraviolet light onto the dicing tape after peeling off the surface protective film.

Specifically, in the eighth aspect of the invention, the dicing tape is cured by the second ultraviolet light radiation means thereby to prevent the adhesive of the dicing tape from sticking to the dicing tape at the time of dicing in a subsequent process.

These and other objects, features and advantages of the present invention will be more apparent in light of the detailed description of exemplary embodiments thereof as illustrated by the drawings.

BRIEF DESCRIPTION OF THE DRAWINGS

FIG. 1 is a plan view of a wafer processing apparatus according to this invention.

FIG. 2 is a side view of the wafer processing apparatus shown in FIG. 1.

DESCRIPTION OF THE PREFERRED EMBODIMENTS

Figure 3A:
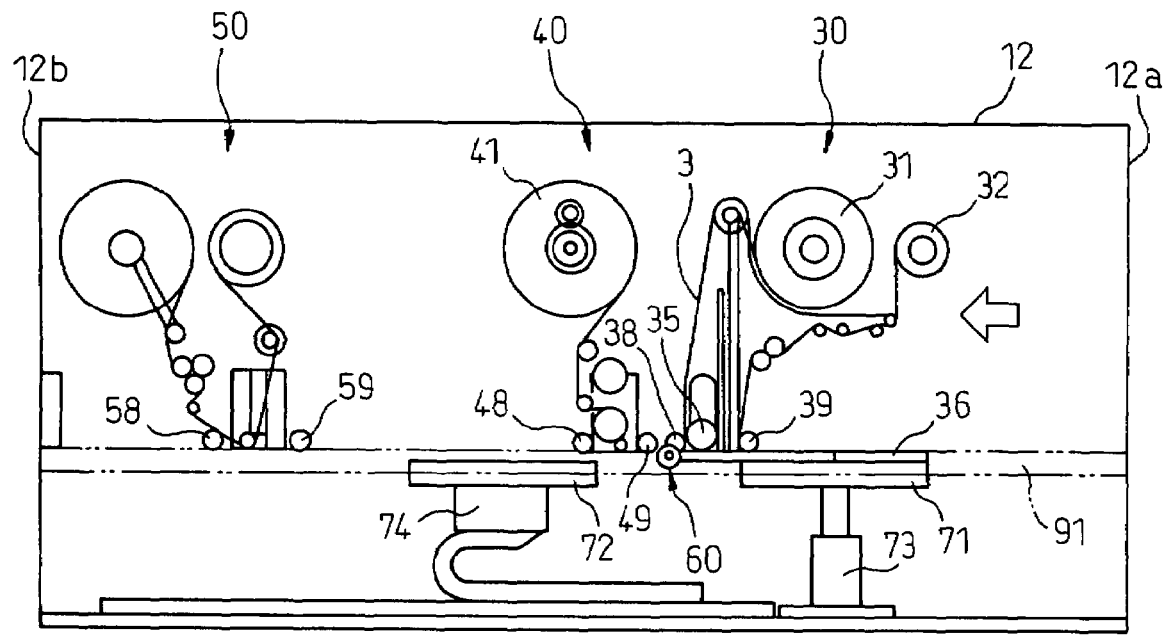
FIG. 3*a* is a first diagram for explaining the operation of the wafer processing apparatus.

Embodiments of the invention are explained below with reference to the accompanying drawings. In these drawings, the same component members are designated by the same reference numerals, respectively. To facilitate the understanding, the scale of the drawings is changed appropriately.

FIG. 1 is a plan view of the wafer processing apparatus according to the invention, and FIG. 2 is a side view of the wafer processing apparatus shown in FIG. 1. In FIG. 1, a wafer processing apparatus 10 is arranged adjacently to a back grinder 1. As shown in FIG. 1, the wafer processing apparatus 10 is coupled to the back grinder 1 by a first UV radiation unit (ultraviolet light radiation unit) 5.

The housing 12 of the wafer processing apparatus 10 shown in FIG. 1 includes a mount frame unit 15 in which a plurality of mount frames 36 are arranged. Also, in the housing 12, a cassette 16 for accommodating the wafers 20 integrated with the mount frames 36 is arranged removably and adjacently to the mount frame unit 15. Further, in FIG. 1, a bar code labeler 11 for attaching a bar code label on the front surface of the tape in the mount frames is arranged in front of the cassette 16 in the housing 12.

As understood from FIG. 2, a plurality of castors 18 and a plurality of stoppers 19 are arranged on the bottom surface of the housing 12. The wafer processing apparatus 10 can be moved to the desired position on the floor L by the castors 18, and fixed at the particular position by the stoppers 19.

Also, as shown in FIG. 2, a door 17 is arranged in the lower part of the wafer processing apparatus 10. By opening the door 17, a control unit 89 such as a digital computer, not shown, arranged in the lower part of the wafer processing apparatus 10 can be accessed. The control unit 89 is for controlling the members of the wafer processing apparatus 10.

Referring to FIG. 1 again, a pair of rails 91, 92 longitudinally extend in the housing 12 of the wafer processing apparatus 10. As viewed from the right side 12*a* of the housing 12, a dicing tape application unit 30, a surplus dicing tape take-up unit 40 and a surface protective film peeling unit 50 are arranged in that order on the rails 91, 92.

Although the linear rails 91, 92 extend along the length of the housing 12 of the wafer processing apparatus 10 in FIG. 1, rails of other shapes can be employed with equal effect. The rails 91, 92 may include, for example, a curved portion along the inner wall of the housing 12 in FIG. 1.

A slider 38 including a shaft 38*a* and rollers 38*b*, 38*c* mounted at the opposite ends of the shaft 38*a* is shown in the lower right part of FIG. 1. The slider 38, together with another slider 39 having a similar configuration, is mounted at the lower end of the dicing tape application unit 30. Sliders 48, 49 having a similar configuration are also mounted at the lower end of the surplus dicing tape take-up unit 40, while sliders 58, 59 having a similar configuration are similarly mounted at the lower ends of the surface protective film peeling unit 50. As shown, the rollers of these sliders slidably engage with the rails 91, 92, respectively. With this configuration, the dicing tape application unit 30, the surplus dicing tape take-up unit 40 and the surface protective film peeling unit 50 can be slid on the common rails 91, 92.

FIGS. 3a to 5b are diagrams for explaining a series of operation of the wafer processing apparatus according to this invention. To facilitate the understanding, a cleaning nozzle 95 described later is not shown in FIGS. 3a to 5b. In FIGS. 3a to 5b, a lift table 71 movable up and down by a lift drive unit 73 is arranged on the right side 12a of the housing 12. A movable table 72 adapted to move along the rails 91, 92 in the longitudinal direction of the housing 12 by a drive unit 74 is arranged on the left side of the lift table 71. The lift table 71 and the movable table 72 can support, by adsorption, the wafer 20 and the mount frame 36.

Also, the drive unit 74 can rotate the movable table 72 around a vertical axis. Further, as shown, a holding unit 60 for holding the edge portion of mount frame 36 is arranged at the center between the lift table 71 and the movable table 72. As can be understood by comparison between FIG. 3a etc. and FIG. 1, a UV radiation unit 5 is coupled to the front (on this side of the page) of the lift table 71.

The operation of the wafer processing apparatus 10 according to the invention is explained below with reference to the drawings.

First, the wafer 20 is supplied to the back grinder 1 with a surface protective film 110 attached on the front surface 21 of the wafer to protect the circuit pattern on the same front surface 21 of the wafer. In the back grinder 1, the back surface 22 of the wafer 20 is ground by a well known method while the surface protective film 110 on the front surface 21 of the wafer 20 is absorbed. As a result, the wafer 20 is ground to the thickness of, say, 50 microns or less. Then, the wafer 20 is supplied to the UV radiation unit 5 with the back surface 22, i.e. the ground surface 22 held by a robot hand or the like not shown.

The stage 5a of the first UV radiation unit 5 coupling the back grinder 1 and the wafer processing apparatus 10 to each other is formed of a transparent hard material, and a UV radiation device not shown is arranged under the stage 5a. While the wafer 20 passes through the first UV radiation unit 5, the front surface 21 thereof, i.e. the surface protective film 110 faces to the stage 5a of the UV radiation unit 5. In the process, the ultraviolet light is radiated on the surface protective film 110 through the stage 5a by the first UV radiation unit 5. As a result, the surface protective film 110 is cured and the adherence thereof to the front surface 21 of the wafer 20 is somewhat reduced, thereby the surface protective film 110 is easily peeled as described later.

In the case where the surface protective film 110 has no ultraviolet curing characteristic, no ultraviolet light of course is radiated by the first UV radiation unit 5 and the wafer 20 simply passes through the UV radiation unit 5.

Then, as shown in FIG. 3a, the dicing tape application unit 30 is slid on the rails 91, 92 leftward of the lift table 71. As a result, a space sufficient to transport the wafer 20 and the mount frame 36 is secured above the lift table 71. After that, the wafer 20 that has passed through the first UV radiation unit 5 is transported to the lift table 71 of the wafer processing apparatus 10 by a robot hand or the like, not shown, and held by adsorption on the lift table 71. In other words, the surface protective film 110 of the wafer 20 is held on the lift table 71, and the back surface 22 of the wafer 20 is exposed. In similar fashion, one mount frame 36 is transported from the mount frame unit 15 to the lift table 71 and similarly held by adsorption on the lift table 71.

The dicing tape application unit 30 includes a supply roll 31 for supplying the dicing tape 3 and a release take-up roll 32 for taking up the released part of the dicing tape 3. As shown, an application roll 35 for attaching the dicing tape 3 on the wafer 20 and the mount frame 36 is arranged in the lower part of the dicing tape application unit 30 between the supply roll 31 and the release take-up roll 32.

The take-up roll 41 of the dicing tape 3 is included in the surplus dicing tape take-up unit 40. Specifically, the dicing tape 3 supplied from the supply roll 31 is taken up by the take-up roll 41 of the surplus dicing tape take-up unit 40 through the application roll 35. As a result, the dicing tape 3 is attached and taken up by the supply roll 31 of the dicing tape application unit 30 and the take-up roll 41 of the surplus dicing tape take-up unit 40 in operatively relation with each other. As can be understood from the drawings, a plurality of guide rolls and/or dancer rolls are arranged between the supply roll 31, the take-up roll 41 and the release take-up roll 32.

Figure 3B:
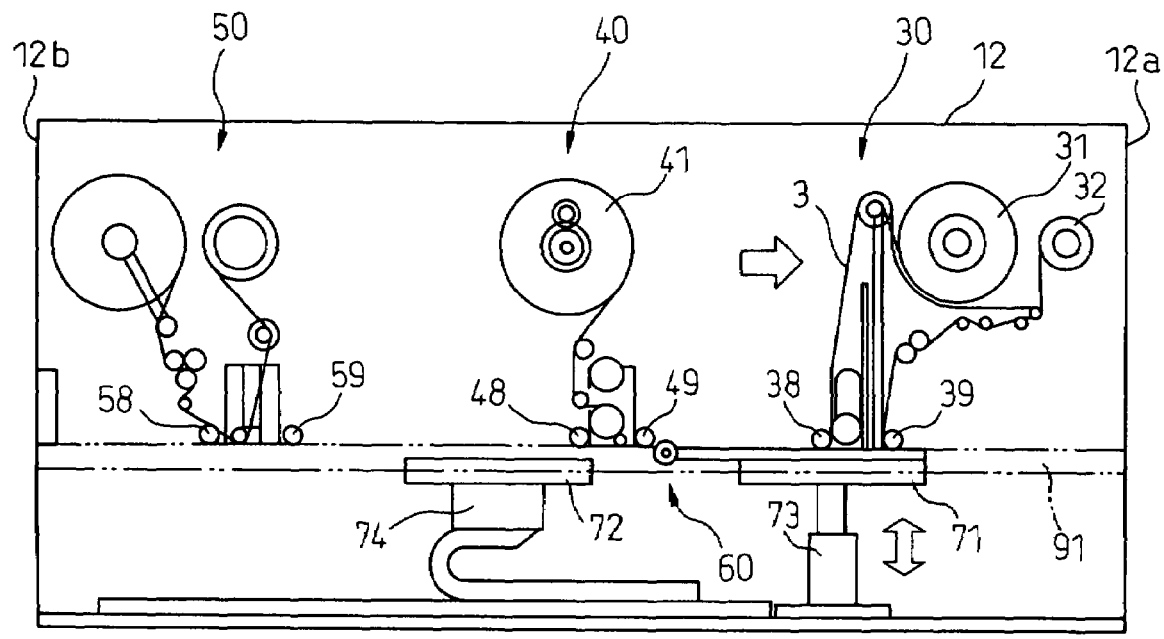
FIG. 3*b* is a second diagram for explaining the operation of the wafer processing apparatus.

Next, as shown in FIG. 3b, the dicing tape application unit 30 is slid along the rails 91, 92, while at the same time attaching the dicing tape 3 on the back surface 22 of the wafer 20 and the mount frame 36 using the application roll 35. When the dicing tape application unit 30 has slid to reach to the right side portion 12a, the application of the dicing tape 3 is finished. As a result, the wafer 20 is integrated with the mount frame 36 and the handling in the subsequent process is facilitated.

Figure 4A:
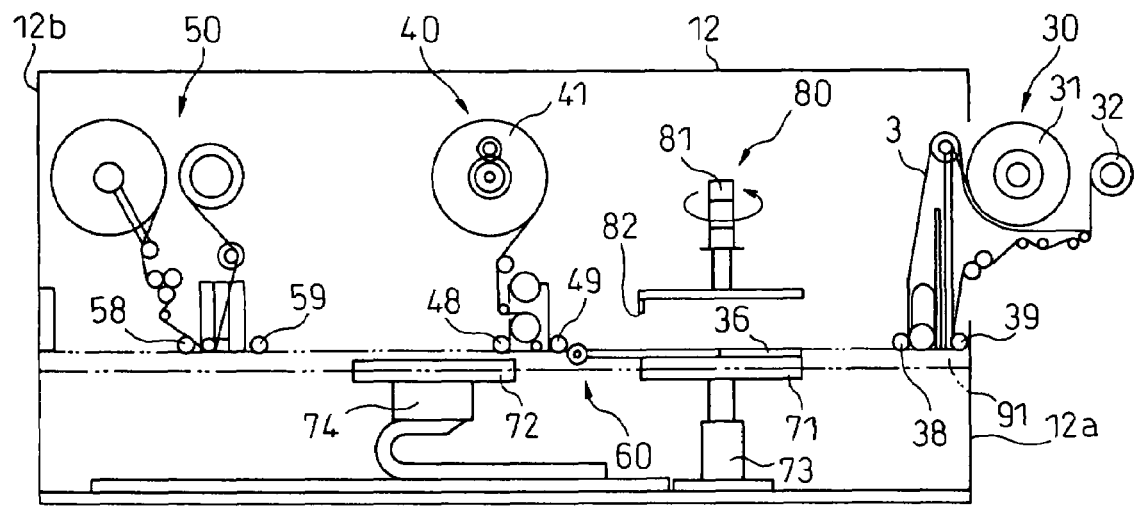
FIG. 4*a* is a third diagram for explaining the operation of the wafer processing apparatus.

As shown in FIG. 4a, the wafer processing apparatus 10 includes a cutting unit 80. The cutting unit 80, normally arranged in front of the inlet of the cassette 16, is moved to a point above the lift table 71 if required. As understood from FIG. 4a, a cutter 82 is rotated around the vertical shaft 81 of the cutting unit 80 thereby to cut the dicing tape 3 into a circle along the surface of the mount frame 36. As a result, a hole corresponding to the profile of the mount frame 36 is formed in the dicing tape. After that, the cutting unit 80 retreats to the original position. The cutting unit 80 is of course not used in the case where the dicing tape 3 is punched in advance.

Figure 4B:
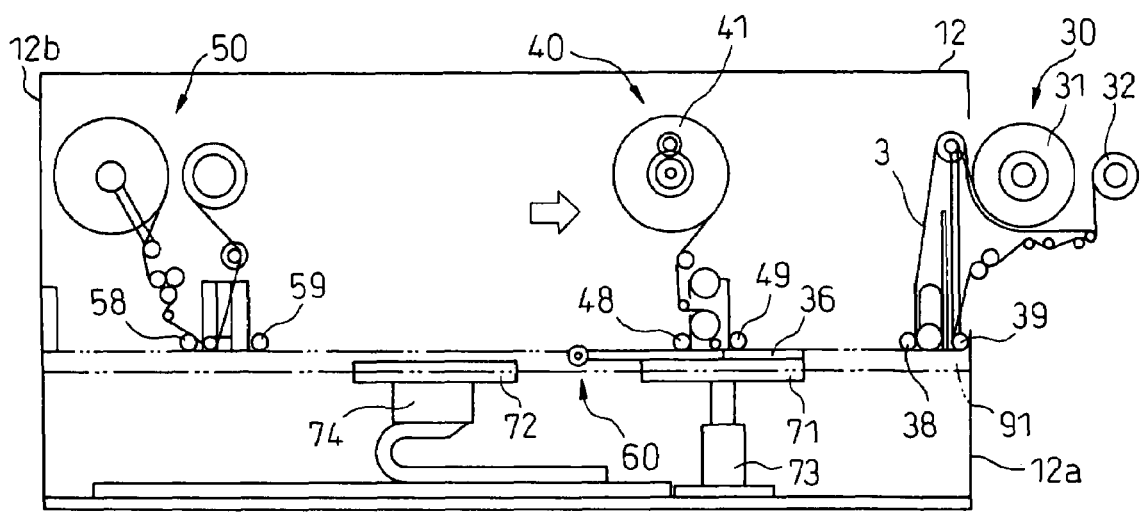
FIG. 4*b* is a fourth diagram for explaining the operation of the wafer processing apparatus.

Next, as shown in FIG. 4b, the surplus dicing tape 3 is taken up the surplus dicing tape take-up unit 40 by driving the take-up roll 41, while at the same time the surplus dicing tape take-up unit 40 is slid toward the right side portion 12a. When the surplus dicing tape take-up unit 40 has slid to reach to a position adjoining the dicing tape application unit 30, the surplus dicing tape 3 has been taken up.

Figure 5A:
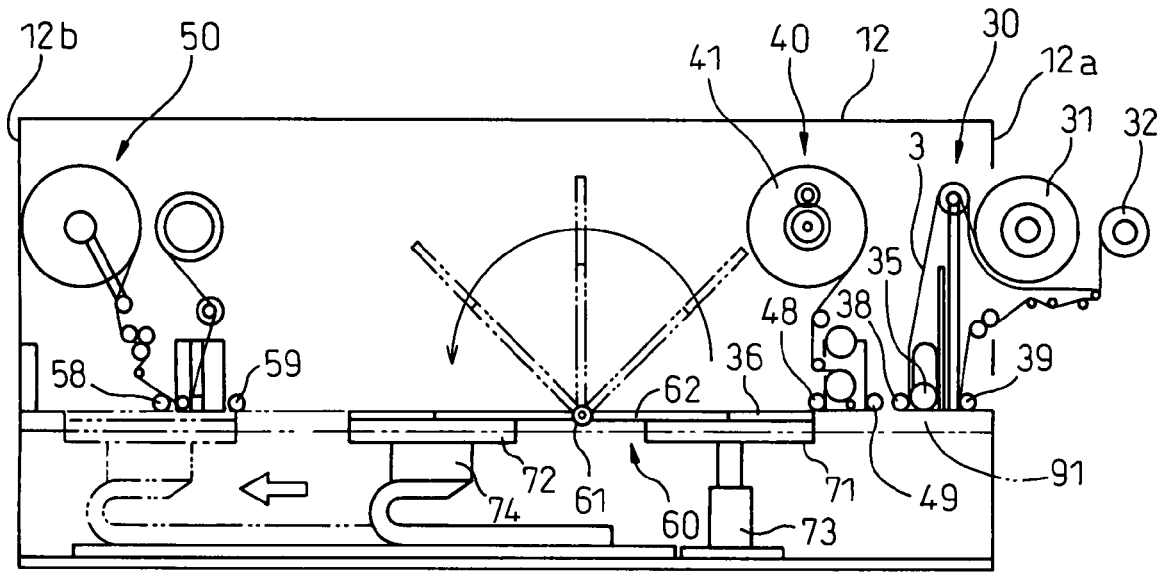
FIG. 5*a* is a fifth diagram for explaining the operation of the wafer processing apparatus.

Next, the wafer 20 is inverted by use of the holding unit 60. This inverting operation is performed in the case where, as shown in FIG. 5a, the surplus dicing tape take-up unit 40 is located at a position near the right side portion 12a adjoining the dicing tape application unit 30 and at the same time, the surface protective film peeling unit 50 is located at a position near the left side portion 12b. Specifically, the inverting operation is performed in the case where a sufficient space is formed between the surplus dicing tape take-up unit 40 and the surface protective film peeling unit 50. As understood from FIG. 5a, this space is formed above the lift table 71 and the movable table 72 in its initial position.

Figure 6A:
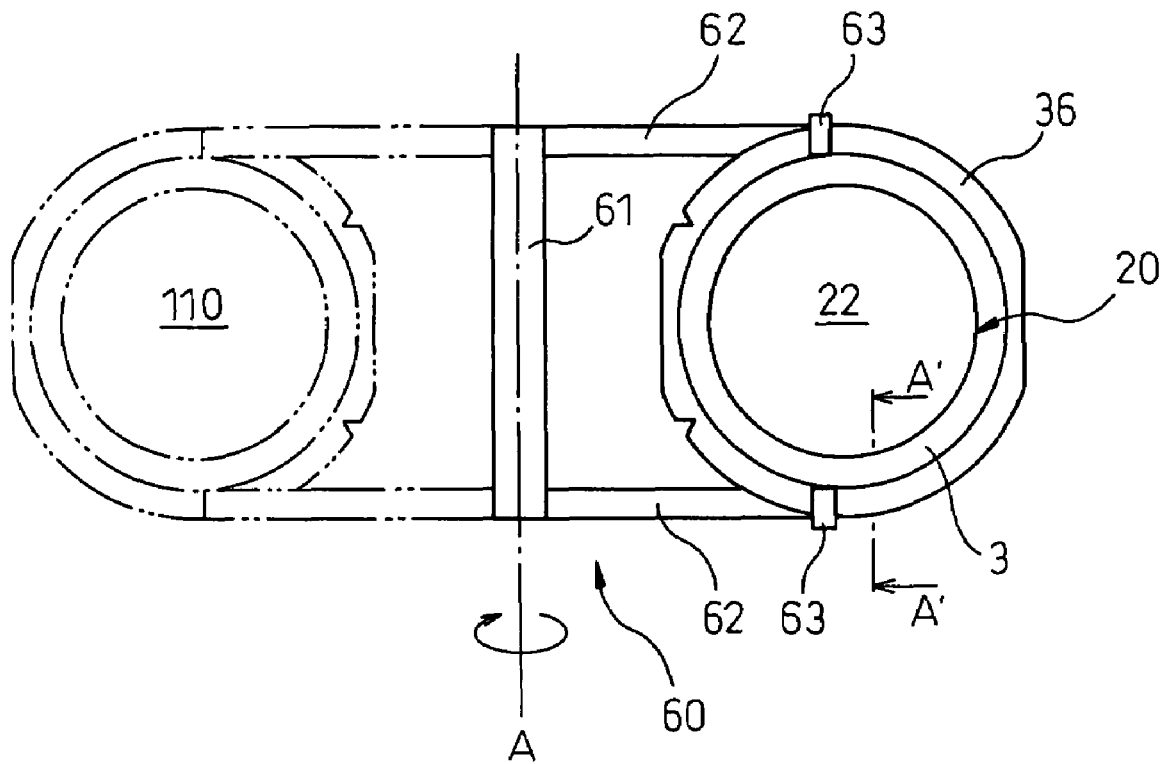
FIG. 6*a* is a top plan view of a holding unit used in the wafer processing apparatus.

The inverting operation is performed by the holding unit for holding the edge portion of mount frame 36. FIG. 6a is a top plan view of the holding unit used in the wafer processing apparatus. As shown in FIG. 6a, the holding unit 60 is configured mainly of a shaft 61 rotated around the axis A and two arms 62 extending from the opposite ends of the shaft 61 thereof in the direction perpendicular to the shaft 61. As can be understood from FIGS. 5a, 6a, the shaft 61 of the holding unit 60 is located outside the mount frame 36, i.e. at a position farther from the lift table 71.

Also, as can be understood from FIG. 1, the shaft 61 is arranged in such a manner as to cross the rails 91, 92, and the two arms 62 extend between the rails 91, 92. The arms 62, though shown to be flush with the rails 91, 92, rotate around the shaft 61 to a position under the rails 91, 92 at other than the time of the inverting operation.

Figure 6B:
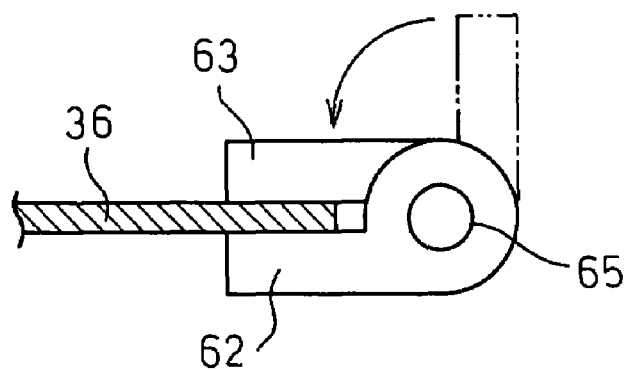
FIG. 6*b* is a sectional view taken in line A'-A' in FIG. 6*a*.

FIG. 6b is a sectional view taken in line A'-A' in FIG. 6a. A shaft portion 65 extending along the length of each arm 62 is mounted at the forward end of the arm 62. Further, a pivot hook portion 63 is arranged pivotably around the shaft portion 65. A normal lift arm and an inverting arm (neither is shown) for the wafer can of course be used to move and invert the wafer.

Upon complete take-up of the surplus dicing tape 3, the arms 62 of the holding unit 60 pivotes around the shaft 61 until they become flush with the rails 91, 92. As a result, the arms 62 come into contact with the edge portion on the bottom side of the mount frame 36. Then, as shown in FIG. 6b, each pivot hook portion 63 is pivoted around the shaft portion 65 so that the mount frame 36 is held by the pivot hook portions 63 and the arms 62.

The inverting operation is explained with reference to FIGS. 5a, 6a. The arms 62 of the holding unit 60 are rotated by 180 degrees around axis A of the shaft 61. As a result, the mount frame 36 held by the holding unit 60 is inverted, together with the wafer 20, while at the same time being transported to the movable table 72. According to this invention, the length of each arm 62 is about one half of the distance between the tables 71, 72. Specifically, according to this invention, the wafer can be inverted while at the same time being transported. Then, the mount frame 36 is released by pivoting the pivot hook portions 63 in the opposite direction, and the mount frame 36 and the wafer 20 are supported on the movable table 72. After that, the holding unit 60 is returned to the original position by being rotated in the opposite direction.

According to this invention, the wafer 20 and the mount frame 36 can be transported to the movable table 72 by the inverting operation around axis A of the shaft 61 located outside the mount frame 36, and therefore, the transport robot arm otherwise required to transport the wafer 20 to the movable table 72 from the lift table 71 can be eliminated.

On the movable table 72, the wafer 20 is supported together with the mount frame 36 with the front surface 21 thereof up. Specifically, on the movable table 72, the surface protective film 110 attached in advance on the front surface 21 of the wafer 20 is exposed. In the surface protective film peeling unit 50 described later, the surface protective film 110 is peeled off from the wafer 20 and, therefore, the inverting operation of the holding unit 60 can be used especially advantageously to transport the wafer 20 from the surplus dicing take-up unit 40 to the surface protective film peeling unit 50.

Also, in view of the fact that the back surface 22 of the wafer 20 is ground with the back grinder 1 and the thickness of the wafer 20 is reduced, the simple inverting operation is advantageous for stable transportation of the wafer 20.

Figure 5B:
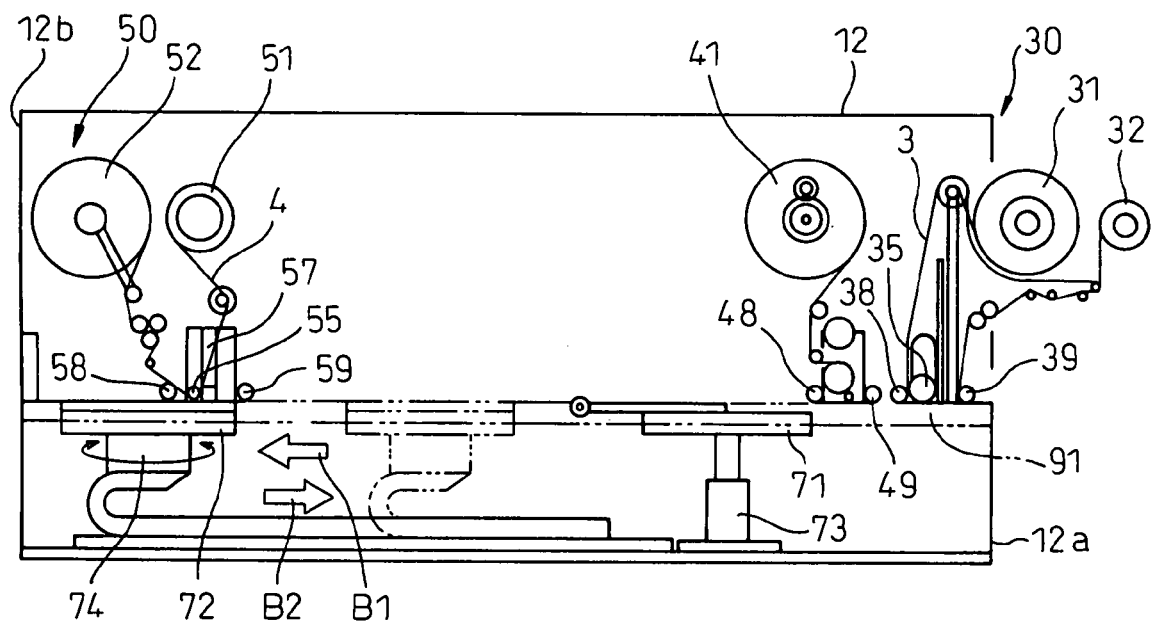
FIG. 5*b* is a sixth diagram for explaining the operation of the wafer processing apparatus.

As understood from FIG. 5b, the surface protective film peeling unit 50 includes a supply roll 51 for supplying the peeling tape 4 and a take-up roll 52 for taking up the peeling tape 4 from the supply roll 51. Further, a peeling roll 55 for attaching the peeling tape 4 on the surface protective film 110 on the wafer 20 is arranged under the surface protective film peeling unit 50 between the supply roll 51 and the take-up roll 52. The peeling tape 4 supplied from the supply roll 51 is taken up on the take-up roll 52 via the peeling roll 55. Also, a depression mechanism 57 included in the surface protective film peeling unit 50 has the function to depress the peeling roll 55 appropriately. As shown, a plurality of guide rolls and/or dancer rolls are seen to be arranged between the supply roll 51 and the take-up roll 52.

Figure 7:
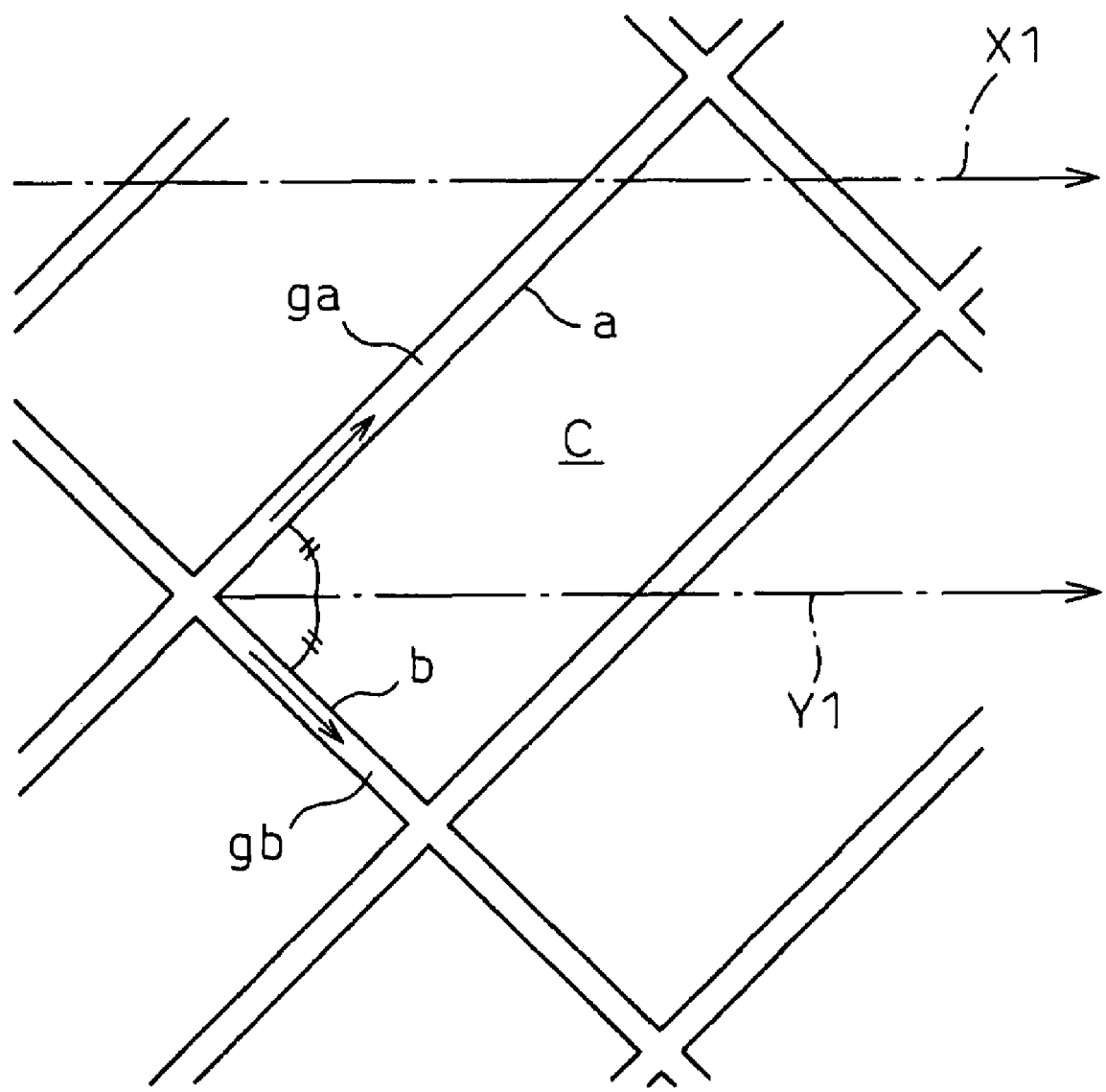
FIG. 7 is a partially enlarged view of the front surface of the wafer.
Figure 8A:
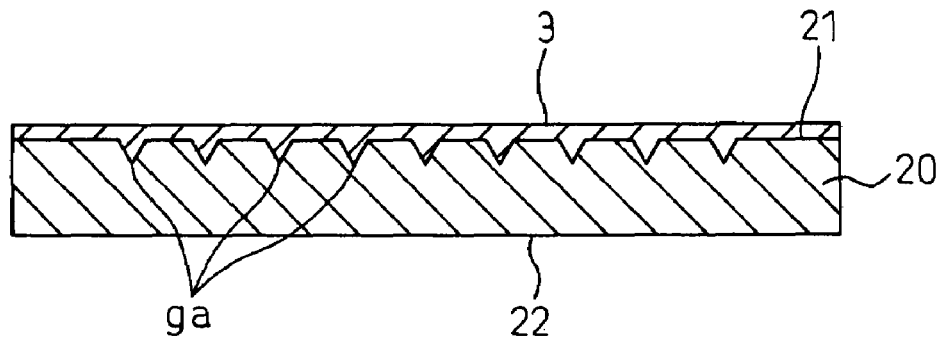
FIG. 8*a* is a sectional view of the wafer taken along a line segment perpendicular to pattern grooves ga.
Figure 8B:
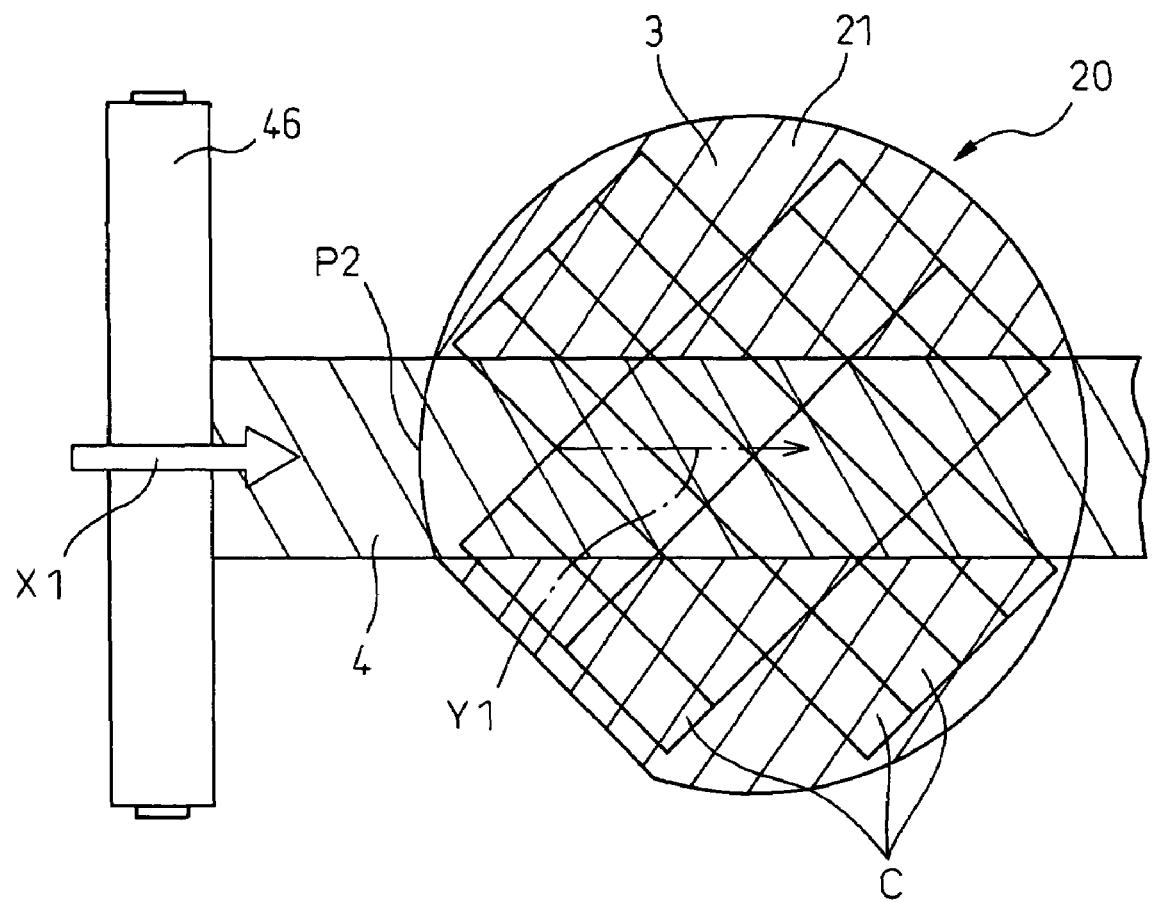
FIG. 8*b* is a plan view schematically showing the wafer and a peeling roller in a surface protective film peeling unit.

As shown in FIG. 7 which is a partly enlarged view of the front surface of the wafer 20, take note of one circuit pattern C of a plurality of circuit patterns formed on the front surface 21 of the wafer 20. The circuit pattern C is substantially in the shape of a rectangle having a long side a and a short side b. Pattern grooves ga, gb corresponding to the respective sides are formed between the adjacent circuit patterns. These pattern grooves ga, gb are preformed in the preceding process. Also, as shown in FIG. 8a, which is a sectional view of the wafer taken along a line segment perpendicular to the pattern grooves ga, the surface protective film 110 attached in advance on the front surface 21 of the wafer 20 enters into the pattern grooves ga, gb.

According to this invention, the movable table 72 is rotated around a vertical axis by driving the drive unit 74, so that the peeling direction X1 in which the surface protective film 110 is peeled is in parallel with the bisector Y1 of the corner of the circuit patterns. The peeling direction X1 is parallel with the rails 91, 92. Specifically, the angle which the pattern grooves ga shown in FIG. 7 form with the peeling direction X1 is equal to the angle which the pattern grooves gb form with the peeling direction X1.

The movable table 72, rotated in this way, is slid in the direction of arrow B1 toward the left side portion 12b as shown in FIG. 5b. When the edge portion of the wafer 20 passes under the peeling roll 55, the peeling roll 55 is pressed against the edge portion of the wafer 20 via the peeling tape 4 by the depression mechanism 57, so that the peeling tape 4 is attached on the surface protective film 110 on the wafer 20. Then, the movable table 72, while being slid further to the left side portion 12b, is collaborated with the operation of the supply roll 51 and the take-up roll 52 thereby to peel off the surface protective film 110 together with the peeling tape 4 from the wafer 20.

After the peeling tape 4 is attached on the edge portion of the wafer 20, the depress operation of the depression mechanism may be canceled.

At the time of peeling the surface protective film 110, as estimated from FIG. 7, an equal force is exerted on the pattern grooves ga, gb, respectively. Therefore, the adhesive of the surface protective film 110 is never left in a great amount in only one of the pattern grooves ga, gb. In other words, the adhesive of the surface protective film 110 is detached in an equal amount from the corners of the circuit patterns along the pattern grooves ga, gb and, therefore, the adhesive is prevented from being left as a residue in the pattern grooves ga, gb.

Next, the wafer 20 from which the surface protective film 110 has been peeled off is transported, together with the mount frame 36, from the movable table 72 to the second UV radiation unit 27. The second UV radiation unit 27 has a similar configuration to the first UV radiation unit 5. Specifically, the stage 27a of the second UV radiation unit 27 is formed of a transparent hard material, and a UV radiation device, not shown, is arranged under the stage 27a.

In the second UV radiation unit 27, the back surface 22 of the wafer 20, i.e. the dicing tape 3 faces the stage 27a. In the second UV radiation unit 27, therefore, the ultraviolet light is radiated on the dicing tape 3 through the stage 27a. The dicing tape 3 having the ultraviolet light curing characteristic is cured by the ultraviolet light radiation. As a result, the adhesive of the dicing tape 3 is prevented from sticking to the dicing blade (not shown) at the time of the subsequent dicing process.

After that, the bar code is attached by the bar code labeler 11 on the front surface of the tape on the mount frame, and the wafer is accommodated in the cassette 16. Specifically, according to this invention, the wafer 20 with the back surface 22 thereof ground by the back grinder 1 is accommodated in the cassette 16 integrally with the mount frame 36 in line. In place of or in addition to the second UV radiation unit 27, an expand unit may be interposed between the surface protective film peeling unit 50 and the bar code labeler 11.

As described above, according to this invention, when using the plurality of the units or the holder 60 in the wafer processing apparatus 10, these units are appropriately slid on the common rails 91, 92 thereby to secure the space required to use each unit. As a result, the operation of each unit can be smoothly performed without the other units constituting an obstacle. Also, it will be understood that the configuration with the units 30, 40, 50 slidable on the rails 91, 92 contributes also to the size reduction of the wafer processing apparatus 10 as a whole.

Figure 9:
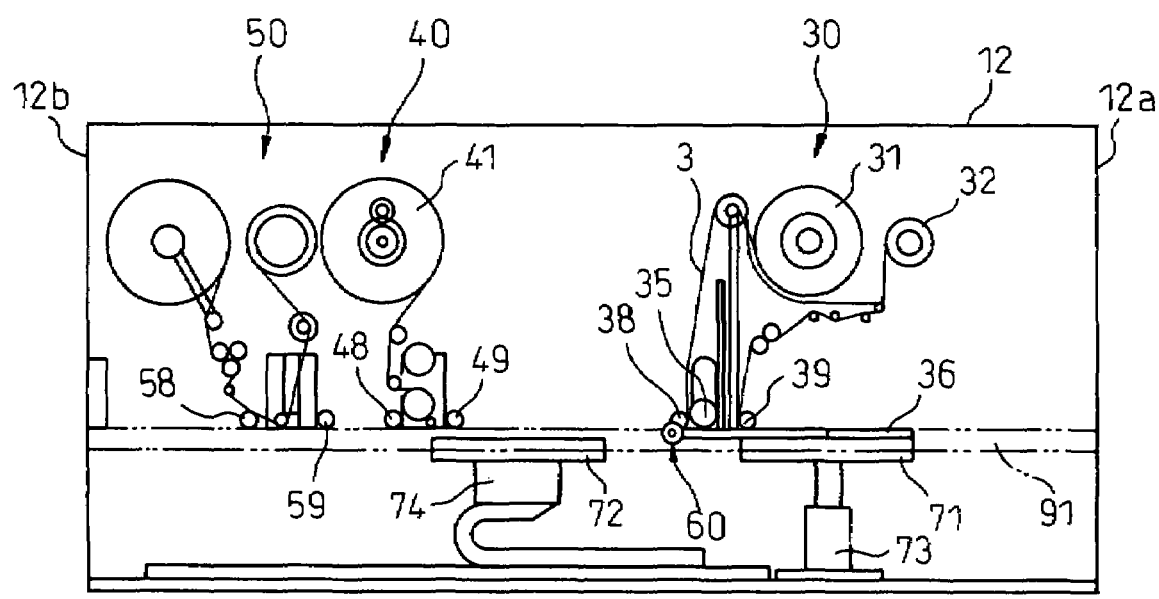
FIG. 9 is a partially enlarged side view of the wafer processing apparatus according to the invention.

Further, the configuration with the units 30, 40, 50 slidable on the rails 91, 92 is advantageous for loading (setting) the roll of the dicing tape 3 or the peeling tape 4 or the maintenance work on a predetermined unit or the tables 71, 72. FIG. 9 is a partly enlarged side view of the wafer processing apparatus according to this invention. In FIG. 9, the dicing tape application unit 30 and the surplus dicing tape take-up unit 40 are slid away from each other. In such a case, a space sufficient to load the roll of the dicing tape 3 on the supply roll 31 can be secured.

In similar fashion, in the case where the roll of the peeling tape 4 is loaded, a space sufficient to load the roll of the peeling tape 4 on the supply roll 51 can be secured by locating the surplus dicing tape take-up unit 40 and the surface protective film peeling unit 50 away from each other. Further, in the case where the maintenance work is carried out on a specific unit, the particular specific unit is slid away from the adjacent unit so that a space sufficiently large to carry out the maintenance work is formed between the units.

As described above, according to this invention, a space sufficient to load the roll or carry out the maintenance work can be secured by appropriately sliding the units. According to this invention, therefore, the tape can be loaded and the maintenance work carried out easily on each unit without interfering with other units.

As shown in FIG. 2, a cleaning nozzle 95 is arranged for the dicing tape application unit 30 and the surface protective film peeling unit 50, respectively. This cleaning nozzle 95 may alternatively be arranged for the surplus dicing tape take-up unit 40. Each cleaning nozzle 95 extends across the rails 91, 92 over the range exceeding at least the diameter of the wafer 20, or preferably, the diameter of the mount frame 36. According to this invention, the wafer 20 or the tapes 71, 72, whenever required to be cleaned during the process of attaching the dicing tape 3 to the process of peeling the surface protective film 110, can be cleaned using the cleaning nozzle 95.

Figure 10A:
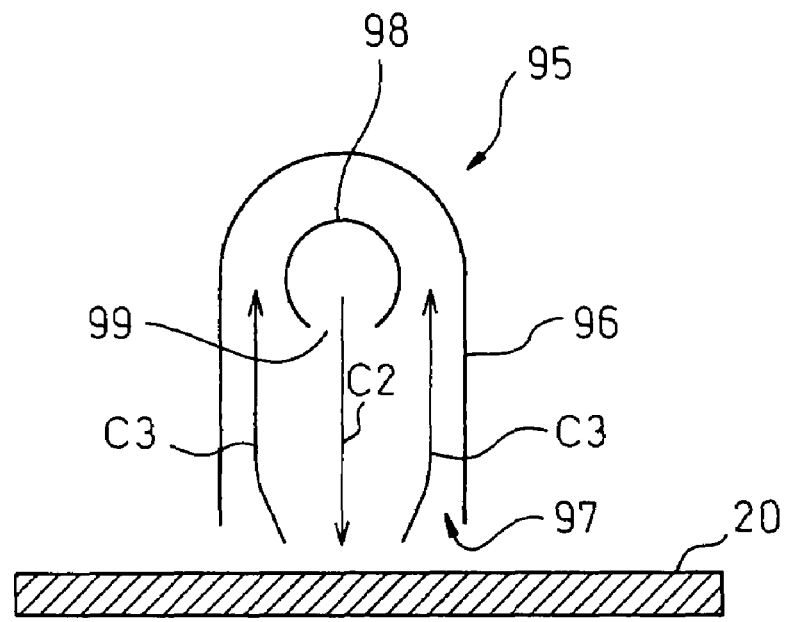
FIG. 10*a* is a sectional view schematically showing a cleaning nozzle.
Figure 10B:
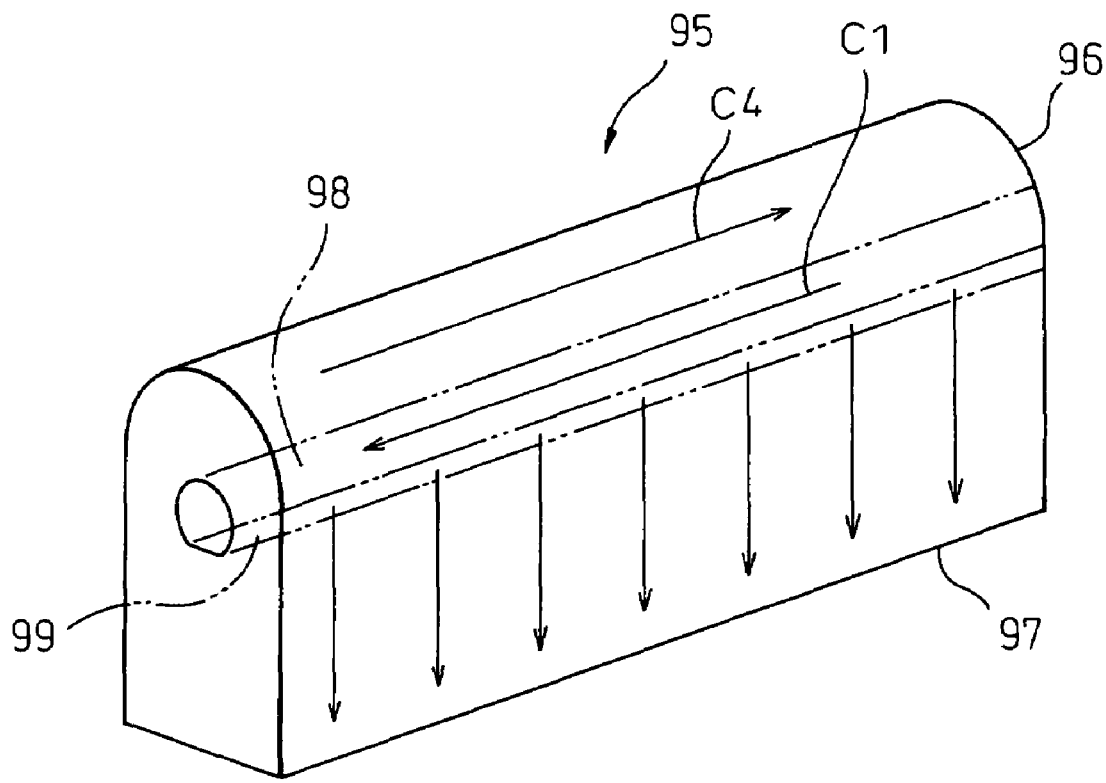
FIG. 10*b* is a perspective view schematically showing the cleaning nozzle of FIG. 10*a*.

FIG. 10a is a sectional view schematically showing the cleaning nozzle, and FIG. 10b a perspective view schematically showing the cleaning nozzle. As shown in FIGS. 10a, 10b, an opening 97 is formed across the rails 91, 92 under the housing 96 of the cleaning nozzle 95. Further, a tube path 98 extends in the direction across the rails 91, 92 in the housing 96. The lower portion of the tube path 98 facing the opening 97 is formed with an opening 99 similarly across the rails 91, 92. As shown in FIGS. 10a, 10b, the opening 97 of the housing 96 and the opening 99 of the tube path 98 are formed on the same side.

As shown in FIGS. 10a, 10b, the cleaning fluid, such as dry air, if supplied into the tube path 98 in the direction of arrow C1, for example, is ejected from the opening 99 along the tube path 98, and flows out from the housing 96 through the opening 97 as indicated by arrow C2. The cleaning fluid that has flowed out from the housing 96 impinges on and cleans the wafer 20 and the like located under the cleaning nozzle 95. After that, the cleaning fluid moves up the inner wall of the housing 96 as indicated by arrow C3 and, by flowing in the direction of arrow C4 in the housing 96, is recovered.

As described above, the cleaning nozzle 95 is arranged on the units 30, 50, etc. sliding on the rails 91, 92, and therefore the wafer 20 can be cleaned in operatively relation with the inherent operation of the units 30, 50. It will be understood that in the processing of a new wafer, for example, the back surface 22 of the wafer 20 on the lift table 71 is cleaned advantageously while sliding the dicing tape application unit 30 to the left side of the lift table 71 before attaching the dicing tape 3 as shown in FIG. 3a.

The chips may be attached on the back surface 22 of the wafer 20 because the back surface 22 is ground on the back grinder 1. By cleaning the back surface 22 using the cleaning nozzle 95 before attaching the dicing tape 3, the chips can be scattered, so that the dicing tape 3 can be attached on a cleaned back surface 22 so that an adherence of the dicing tape 3 can be improved.

For a similar reason, the surface protective film 110 attached on the front surface 21 of the wafer 20 may be cleaned by the cleaning nozzle 95 of the surface protective film peeling unit 50 before attaching the peeling tape 4. Incidentally, the cleaning nozzle 95 may be used for cleaning the top surfaces of the tables 71, 72 as well as for cleaning the wafer 20. Further, the cleaning may be conducted by moving the movable table 72 as well as by sliding the units 30, 50. Also, this cleaning operation may be carried out when returning the table 72 in the direction of arrow B (FIG. 5b) after complete operation of peeling the surface protective film 110. In this way, according to this invention, the wafer 20 or the tables 71, 72 can be cleaned appropriately without using a separate cleaning unit (not shown).

Further, though not shown, the tape roll with the adhesive tape wound reversely (wound with the adhesive surface out) may be fed while in contact with the front surface of the adsorption tables 71, 72 thereby to remove the foreign matter generated by back grinding from the wafer surface. As another alternative, the reversely-wound tape and the adhesive roll can be combined with each other. In this case, the foreign matter on the front surface of the adsorption tables 71, 72 is adhered on the adhesive roll, and then, the foreign matter attached on the adhesive roll is transferred to the reverse winding tape roll. Incidentally, in the case where foreign matter is attached on the reverse winding tape roll to some degree, the new adhesive surface of the reverse winding tape roll may be used by removing the tape on the outer surface of the reverse winding tape roll.

Although the embodiments of the invention are explained above with reference to the drawings, this invention is also applicable to the processing of the wafer 20 subjected to what is called "pre-dicing". Specifically, by dicing the wafer 20 from the front surface 21 thereof, on which circuit patterns are formed, to a predetermined depth in the thickness direction of the wafer, bottomed grooves are formed to generate dices, and the surface protective film 110 is attached on the front surface of the wafer, after which the back surface 22 of the wafer 20 is ground to the bottomed grooves and thus, the wafer 20 is divided into a multiplicity of chips. Then, the wafer 20 with the surface protective film 110 attached thereon is attached on the mount frame 36, after which the subsequent cleaning, drying and die bonding steps can be carried out.

The embodiments are described above with reference to the drawings on the assumption that the wafer processing apparatus 10 is a different member from the back grinder 1 and the first UV radiation unit 5. This invention is apparently applicable, however, in the case where the wafer processing apparatus 10 includes the back grinder 1 and the first UV radiation unit 5.

Although the invention has been shown and described with exemplary embodiments thereof, it should be understood by those skilled in the art that the foregoing and various other changes, omissions and additions may be made therein and thereto without departing from the scope of the invention.

The invention claimed is:

1. A wafer processing apparatus for processing a wafer having a front surface, and a back surface on which a circuit pattern is formed and a surface protective film is attached comprising:
   a dicing tape application unit for attaching a dicing tape on a mount frame and the back surface of the wafer to integrate the mount frame and the wafer;
   a surplus dicing tape take-up unit for taking up a surplus part of the dicing tape attached on the mount frame and the wafer,
   wherein the dicing tape application unit and the surplus dicing tape take-up unit are arranged slidably with respect to each other on at least one rail of the wafer processing apparatus; and
   a table for supporting the wafer, wherein the table is capable of rotating around a vertical axis, wherein the table is rotated in such a manner that a peeling direction in which the surface protective film is peeled by the surface protective film peeling unit and a bisector of a corner of the circuit pattern of the wafer supported on the table are substantially parallel to each other.

2. A wafer processing apparatus according to claim 1, further comprising a surface protective film peeling unit for peeling a surface protective film from the front surface of the wafer using a peeling tape,
   wherein the surface protective film peeling unit is slidably arranged on the at least one rail, with respect to the dicing tape application unit and the surplus dicing tape take-up unit.

3. A wafer processing apparatus according to claim 1,
   wherein the surface protective film has an ultraviolet curing characteristic and is adapted to be cured by a radiation of an ultraviolet light thereon, the apparatus further comprising a first ultraviolet light radiation means for radiating the ultraviolet light on a surface protective film before the surface protective film is peeled.

4. A wafer processing apparatus according to claim 2,
   wherein the dicing tape application unit, the surplus dicing tape take-up unit and the surface protective film peeling unit are slidably arranged in order on the at least one rail.

5. A wafer processing apparatus according to claim 2,
   wherein at least one of the dicing tape application unit, the surplus dicing tape take-up unit and the surface protective film peeling unit has a cleaning nozzle for supplying a cleaning fluid.

6. A wafer processing apparatus according to claim 2, further comprising a holding means for holding the mount frame of the wafer,
   wherein after the surplus dicing tape is taken up by the surplus dicing tape take-up unit, the holding means is configured to rotate the mount frame together with the wafer by 180 degrees around a horizontal rotation axis to transport while inverting the mount frame and the wafer.

7. A wafer processing apparatus for processing a wafer having a front surface and a back surface, on which a circuit pattern is formed and a surface protective film is attached comprising:
   a dicing tape application unit for attaching a dicing tape on a mount frame and the back surface of the wafer to integrate the mount frame and the wafer; and
   a surplus dicing tape take-up unit for taking up a surplus part of the dicing tape attached on the mount frame and the wafer,
   wherein at least one of the dicing tape application unit and the surplus dicing tape take-up unit, is arranged slidably on at least one rail of the wafer processing apparatus, and
   wherein the dicing tape has an ultraviolet curing characteristic and is adapted to be cured by a radiation of an ultraviolet light thereon,
   the apparatus further comprising an ultraviolet light radiation means for radiating the ultraviolet light on the dicing tape after the surface protective film is peeled.

* * * * *